US012677647B2

(12) United States Patent　　(10) Patent No.:　US 12,677,647 B2
Park et al.　　　　　　　　　　　(45) Date of Patent:　　Jul. 7, 2026

(54) DIFFUSION PREVENTION SPACER

(71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Shatin (HK); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 881 days.

(21) Appl. No.: 17/451,686

(22) Filed: Oct. 21, 2021

(65) Prior Publication Data

US 2023/0125615 A1　　Apr. 27, 2023

(51) Int. Cl.
H10W 20/00　　(2026.01)
H10W 20/41　　(2026.01)
H10W 20/42　　(2026.01)

(52) U.S. Cl.
CPC ....... H10W 20/035 (2026.01); H10W 20/037 (2026.01); H10W 20/069 (2026.01); H10W 20/089 (2026.01); H10W 20/098 (2026.01); H10W 20/42 (2026.01); H10W 20/425 (2026.01); H10W 20/435 (2026.01)

(58) Field of Classification Search
CPC ......... H01L 21/76834; H01L 21/76807; H01L 23/53238; H01L 23/53266; H01L 23/5266; H01L 23/5221; H10W 20/42; H10W 20/421; H10W 20/422; H10W 20/43; H10W 20/432; H10W 20/425
See application file for complete search history.

(56) References Cited

U.S. PATENT DOCUMENTS

| | | | |
|---|---|---|---|
| 6,372,649 B1 * | 4/2002 | Han ................. | H01L 21/76885 |
| | | | 438/743 |
| 7,541,276 B2 | 6/2009 | Kim et al. | |
| 7,842,615 B2 | 11/2010 | Park | |
| 9,059,257 B2 | 6/2015 | Li et al. | |
| 9,076,844 B2 | 7/2015 | Bright et al. | |
| 9,324,650 B2 | 4/2016 | Edelstein et al. | |
| 9,793,156 B1 | 10/2017 | Yang | |
| 9,806,023 B1 | 10/2017 | Briggs et al. | |
| 9,953,865 B1 | 4/2018 | Briggs et al. | |
| 10,431,494 B2 | 10/2019 | Yang et al. | |
| 10,553,532 B2 | 2/2020 | Schenker et al. | |

(Continued)

*Primary Examiner* — Jesse Y Miyoshi
(74) *Attorney, Agent, or Firm* — Samuel A. Waldbaum

(57)　　ABSTRACT

A method of making a semiconductor component includes forming an interconnect in a dielectric layer such that an uppermost surface of the interconnect is substantially coplanar with an uppermost surface of the dielectric layer. The method further includes recessing the dielectric layer such that the uppermost surface of the dielectric layer is lower than the uppermost surface of the interconnect. The method further includes forming spacers in direct contact with the uppermost surface of the recessed dielectric layer such that the spacers are in direct contact with the interconnect. The method further includes recessing the interconnect such that the uppermost surface of the interconnect remains above the uppermost surface of the recessed dielectric layer and is lower than an uppermost surface of the spacers.

10 Claims, 11 Drawing Sheets

(56)  References Cited

U.S. PATENT DOCUMENTS

| | | | | |
|---|---|---|---|---|
| 10,886,176 | B2 | 1/2021 | Kikuchi et al. | |
| 10,957,584 | B2 | 3/2021 | Briggs et al. | |
| 2002/0086518 | A1* | 7/2002 | Asami | H01L 21/76807 |
| | | | | 438/653 |
| 2003/0183940 | A1* | 10/2003 | Noguchi | H01L 23/53295 |
| | | | | 257/E21.589 |
| 2008/0174019 | A1* | 7/2008 | Ryu | H01L 21/76834 |
| | | | | 438/653 |
| 2008/0277797 | A1* | 11/2008 | Yu | H01L 23/5283 |
| | | | | 257/762 |
| 2008/0284024 | A1* | 11/2008 | Ryu | H01L 21/76849 |
| | | | | 257/751 |
| 2009/0051033 | A1* | 2/2009 | Gosset | H01L 23/53295 |
| | | | | 257/E23.142 |
| 2013/0001796 | A1* | 1/2013 | Song | H01L 23/5226 |
| | | | | 257/774 |
| 2013/0082393 | A1* | 4/2013 | Kawamura | H01L 21/76802 |
| | | | | 257/773 |
| 2018/0342459 | A1* | 11/2018 | Chan | H01L 23/53223 |
| 2020/0035605 | A1* | 1/2020 | Tsai | H01L 21/76877 |
| 2020/0135562 | A1* | 4/2020 | Chen | H01L 21/02164 |
| 2021/0151677 | A1 | 5/2021 | Lin et al. | |

* cited by examiner

100

Form lower level
104

Form spacers
108

Form second dielectric layer
112

Upper level metallization
116

DIFFUSION PREVENTION SPACER

BACKGROUND

The present disclosure relates to the electrical, electronic, and computer fields. In particular, the present disclosure relates to the interconnects of semiconductor devices and methods of making the interconnects of semiconductor devices.

In integrated circuits, interconnects are structures that connect two or more circuit elements together electrically. In addition to providing the electrical connection to the front end devices (such as transistors), interconnects also go all the way back to the power delivery networks. Thus, interconnects, and their surrounding support components, are considered back-end-of-line (BEOL) components. Lines provide electrical connection within a single layer, and vias provide electrical connection between layers in a physical electronic circuit.

SUMMARY

Embodiments of the present disclosure include a method of making a semiconductor component. The method includes forming an interconnect in a dielectric layer such that an uppermost surface of the interconnect is substantially coplanar with an uppermost surface of the dielectric layer. The method further includes recessing the dielectric layer such that the uppermost surface of the dielectric layer is lower than the uppermost surface of the interconnect. The method further includes forming spacers in direct contact with the uppermost surface of the recessed dielectric layer such that the spacers are in direct contact with the interconnect. The method further includes recessing the interconnect such that the uppermost surface of the interconnect remains above the uppermost surface of the recessed dielectric layer and is lower than an uppermost surface of the spacers.

Additional embodiments of the present disclosure include a semiconductor component. The semiconductor component includes a dielectric layer having an uppermost surface. The semiconductor component further includes an interconnect formed in the dielectric layer. The interconnect has an uppermost surface that is arranged higher than the uppermost surface of the dielectric layer. The semiconductor component further includes spacers arranged in direct contact with the uppermost surface of the dielectric layer. Each spacer has an uppermost surface that is arranged higher than the uppermost surface of the interconnect.

Additional embodiments of the present disclosure include a method of making a semiconductor component. The method includes forming an interconnect in a dielectric layer such that an uppermost surface of the interconnect is higher than an uppermost surface of the dielectric layer. The method further includes forming spacers in direct contact with the uppermost surface of the dielectric layer and in direct contact with the interconnect. The method further includes forming a capping layer on the uppermost surface of the interconnect between the spacers. The method further includes forming a further dielectric layer above the uppermost surface of the dielectric layer. The method further includes forming a trench in the further dielectric layer such that a bottom of the trench is arranged above the capping layer. The method further includes removing the capping layer. The method further includes forming a further interconnect in the trench.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Figure 1:
FIG. 1 illustrates a flowchart of an example method for forming a semiconductor component, in accordance with embodiments of the present disclosure.
Figure 1:
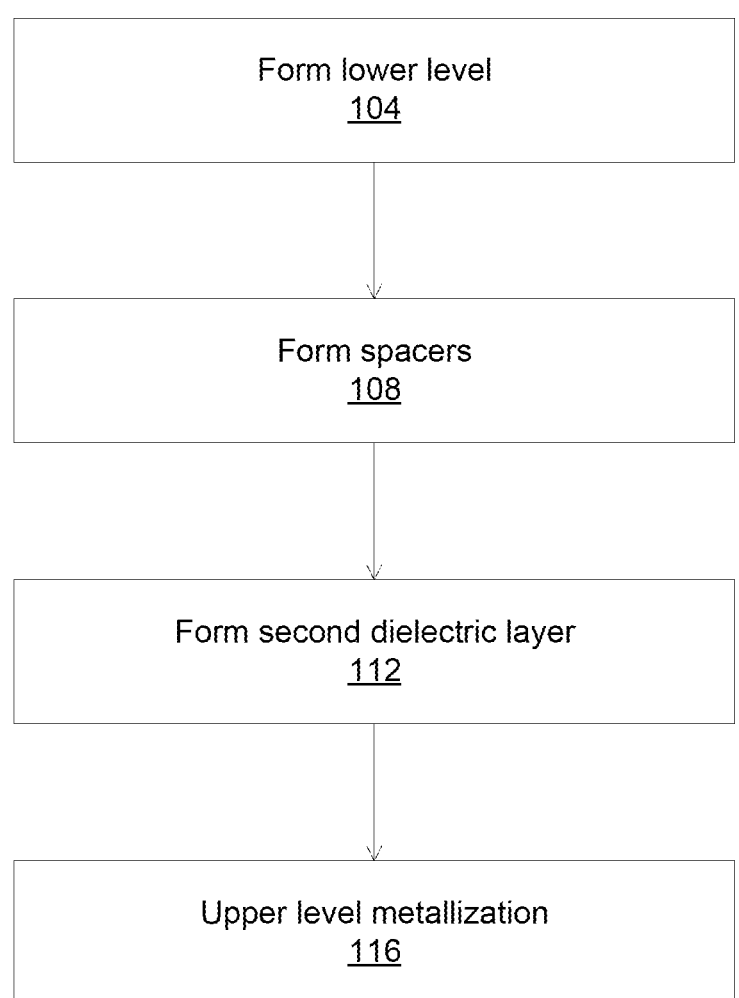

Aspects of the present disclosure relate generally to the electrical, electronic, and computer fields. In particular, the present disclosure relates to semiconductor devices. While the present disclosure is not necessarily limited to such applications, various aspects of the disclosure may be appreciated through a discussion of various examples using this context.

Various embodiments of the present disclosure are described herein with reference to the related drawings.

Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, in integrated circuits, interconnects are structures that connect two or more circuit elements (such as transistors or power rails) together electrically. In addition to providing the electrical connection to the front end devices (such as transistors), interconnects also go all the way back to the power delivery networks. Thus, interconnects, and their surrounding support components, are considered back-end-of-line (BEOL) components. Lines provide electrical connection within a single layer, and vias provide electrical connection between layers in a physical electronic circuit.

Fully aligned via (FAV) is a BEOL integration scheme in which the via is self-aligned to the metal interconnect layer above and the metal interconnect layer below. The improved interlayer alignment enables superior contact between vias and lines of adjacent layers. The integration scheme includes creating a guiding topography to align the via with the metal interconnect layer below and using a conventional trench hard mask to align the via to the metal interconnect layer above. Advantages of the FAV scheme include improved alignment precision and an increase in interlayer spacing, which enable improved BEOL reliability.

One way to form the guiding topography for FAV interconnect structures is to selectively recess the lower level metal lines. The recesses form gaps which serve as the guiding topography relative to the surrounding (un-recessed) dielectric material. Subsequently, additional dielectric material is deposited over the entire structure, which includes filling the gaps. However, as interconnect technology is scaled to smaller sizes, the widths of the metal lines get narrower, and it becomes increasingly difficult to produce robust and complete areas of dielectric material surrounding FAV interconnect structures, including while filling such gaps. In particular, it is desirable to minimize voids that are formed in the dielectric material during filling.

Low-k dielectric materials are preferred for surrounding FAV interconnect structures, but it can be difficult to fill spaces and gaps between the interconnect structures with such materials. One way to improve the quality of the fill and reduce voids is to use flowable chemical vapor deposition (FCVD) to fill the spaces and gaps in FAV interconnect structures with low-k dielectric materials. Unfortunately, low-k dielectrics are prone to plasma damage during subsequently applied conventional patterning processes, such as reactive ion etching (RIE). Such damage allows capping and/or liner materials to diffuse into the damaged dielectric. This diffusion leads to problematic shorting, deterioration, and breakdown of the dielectric around the metal lines in FAV structures.

Embodiments of the present disclosure may overcome these and other drawbacks of existing solutions by providing a physical barrier between capping and/or liner materials in the interconnect recesses and the surrounding dielectric materials. As discussed in further detail below, such embodiments include forming a spacer near the top of an interconnect recess to create further physical separation between the capping and/or liner materials and the surrounding dielectric materials. The spacer greatly elongates the migration path for any capping and/or barrier materials to travel before they can reach surrounding dielectric materials. By preventing any direct migration path to the surrounding dielectric materials, such embodiments prevent the diffusion of capping and/or liner materials into surrounding dielectric material in FAV interconnect structures.

In general, the various processes used to form lines and vias for a semiconductor chip or micro-chip that will be packaged into an IC fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up a transistor and the many wires that connect the millions of transistors of a circuit, lithography and etch pattern transfer steps are repeated multiple times. Each pattern being printed on the substrate is aligned to previously formed patterns, and gradually the conductive and insulative regions are built up to form the final device.

These processes can be used in different combinations and orders within the context of two main integration schemes for forming lines and vias. A subtractive scheme refers to processes of forming line and via structures by depositing metal, and then etching the metal to form lines and vias. Alternatively, a damascene scheme refers to the processes of forming line and via structures by depositing an oxide layer, forming a trench into the oxide layer, and then depositing metal into the trench. In particular, in a typical dual damascene process (also referred to as a dual damascene flow), a structure undergoes a diffusion barrier etch step, then a via dielectric is deposited. A subsequent etch step then forms a gap in which metal is deposited to form the lines and vias simultaneously. Subtractive and damascene schemes can both be used in the formation of complex interconnect structures.

FIG. 1 depicts a flowchart of an example method 100 for forming a semiconductor component, according to embodiments of the present disclosure. The method 100 begins with operation 104, wherein a lower level of the interconnect structure is formed. In accordance with at least one embodiment of the present disclosure, operation 104 further includes a number of sub-operations.

More specifically, the performance of operation 104 includes forming a first dielectric layer, forming a lower level recess in the first dielectric layer, coating the resulting structure with a barrier, coating the resulting structure with a liner, and filling the remaining volume in the lower level recess with interconnect material. In the present disclosure, the barrier, liner, and interconnect material may be referred to collectively as an interconnect. For clarity, the interconnect material may then be referred to as forming an interconnect body to distinguish the interconnect material from the entirety of the interconnect.

The barrier covers the first dielectric layer, including the surfaces of the lower level recess. Accordingly, the barrier is in direct contact with the first dielectric layer. The liner covers the barrier, including within the lower level recess. Accordingly, the liner is in direct contact with the barrier. Additionally, the interconnect material is in direct contact with the liner. In some embodiments of the present disclosure, this interconnect is a lower level line of a subsequently formed semiconductor component. In conventional fabrication processes, the first dielectric layer includes many lower level recesses. Therefore, the semiconductor component can include many lower level lines. For simplicity, the method is described with reference to one lower level recess and one interconnect which can be illustrative of more than one such lower level recess and interconnect.

In accordance with at least one embodiment, the first dielectric layer may be made of a low-k dielectric material. In particular, the low-k dielectric material may be one that is suitable for application by FCVD.

Selecting a material to use for the barrier depends on the desired resistivity and adhesion that the material will provide to the interconnect structure. Tantalum disulfide (TaS2) is one illustrative material that can be well suited for use for a barrier because it provides good barrier performance against copper diffusion, even at very thin thicknesses (for example, thicknesses of approximately 1.5 nanometers). Additionally, as a liner, TaS2 has good adhesion to copper and to dielectric materials. Accordingly, TaS2 can be used both to prevent problematic copper diffusion and to promote adhesion of copper within the dielectric material. Alternatively, the barrier may be made of another material with good adhesion to the low-k dielectric material and that provides robust isolation of materials from the low-k dielectric material. In accordance with at least one embodiment, the material of the barrier may be, for example, tantalum. In accordance with at least one embodiment, the barrier may have a thickness of, for example, approximately 1 to approximately 3 nanometers.

The liner is made of a material that provides a good interface for the interconnect material that will ultimately be used to fill the recesses to form the lines in the lower level of the semiconductor component. Cobalt is one illustrative material that can be well suited for such applications because it provides good adhesion for copper, which is the most commonly used interconnect material. Furthermore, cobalt provides a good wetting layer, which further promotes the completeness of the filling of the recesses with interconnect material. Accordingly, in accordance with embodiments of the present disclosure, the liner can be made of cobalt. In accordance with at least one embodiment, the cobalt can be applied by CVD. In such embodiments, the CVD cobalt liner can provide good fill reliability and yield in small lines and vias.

Following the formation of the first dielectric layer, the barrier, and the liner, and the interconnect material filling, the performance of operation 104 includes performing CMP on the structure to remove excess materials and planarize the structure. Accordingly, following the performance of operation 104, the uppermost surfaces of each of the first dielectric layer, the barrier, the liner, and the interconnect material are substantially coplanar with one another.

Figure 2A:
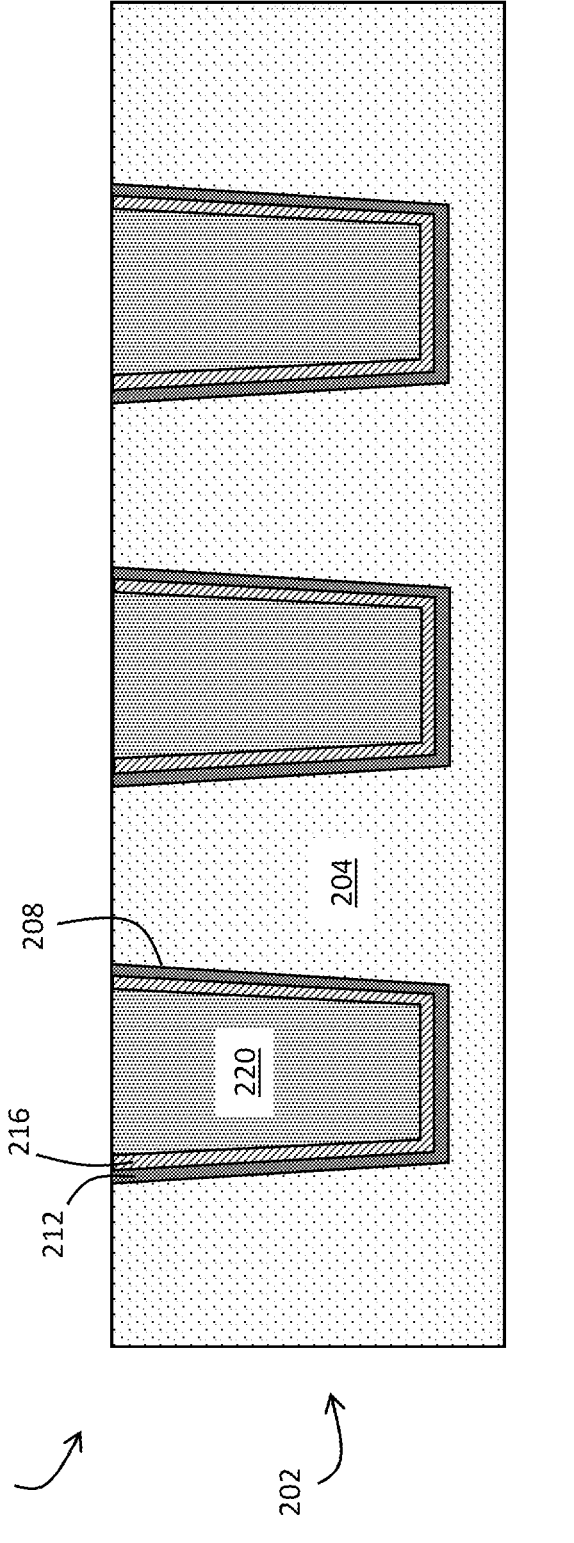
FIG. 2A illustrates an example of a component following the performance of a portion of the example method of FIG. 1, in accordance with embodiments of the present disclosure.

FIG. 2A depicts an example structure 200 following the performance of the above portions of operation 104. In particular, FIG. 2A depicts a lower level 202 of the structure 200. The lower level 202 includes a first dielectric layer 204 and a lower level recess 208 formed in the first dielectric layer 204. As shown, surfaces of the lower level recess 208 are coated with a barrier 212. Additionally, surfaces of the barrier 212 that are not in direct contact with the first dielectric layer 204 are coated with a liner 216. Additionally, remaining volume in the lower level recess 208 that is not occupied by the barrier 212 or the liner 216 is filled with interconnect material to form a lower level interconnect 220. In the embodiment shown, the lower level interconnect 220 is a line.

Returning to FIG. 1, following the performance of operation 104, the method 100 proceeds with the performance of operation 108, wherein the spacers are formed. In accordance with at least one embodiment of the present disclosure, the performance of operation 104 further includes the performance of a number of sub-operations.

More specifically, operation 108 includes recessing the dielectric material of the first dielectric layer such that a portion of the barrier is exposed. In other words, operation 108 includes removing an amount of the dielectric material of the first dielectric layer such that the uppermost surface of the first dielectric layer is no longer substantially coplanar with the uppermost surfaces of the barrier, the liner, and the interconnect material. Thus, by recessing the first dielectric layer, side surfaces of the barrier that are not in direct contact with the liner are exposed. In accordance with at least one embodiment of the present disclosure, the first dielectric layer can be recessed approximately 10 to approximately 20 nanometers relative to the uppermost surfaces of the barrier, the liner, and the interconnect material. Therefore, following the performance of this portion of operation 108, the uppermost surface of the first dielectric layer is lower than the uppermost surfaces of the barrier, the liner, and the interconnect material.

Figure 2B:
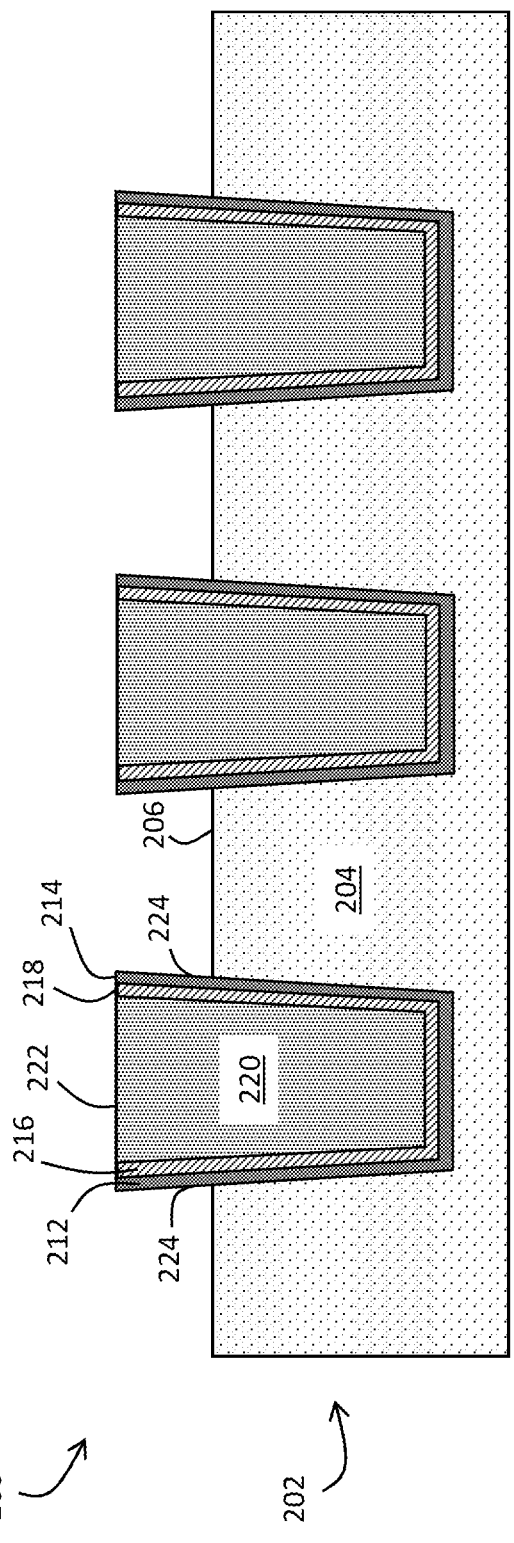
FIG. 2B illustrates an example of a component following the performance of a portion of the example method of FIG. 1, in accordance with embodiments of the present disclosure.

FIG. 2B depicts the structure 200 following the performance of the above portion of operation 108. In particular, FIG. 2B depicts an uppermost surface 206 of the first dielectric layer 204 that has been recessed relative to an uppermost surface 214 of the barrier 212, an uppermost surface 218 of the liner 216, and an uppermost surface 222 of the lower level interconnect 220. As shown, recessing the first dielectric layer 204 in this manner exposes side surfaces 224 of the barrier 212 that are not in direct contact with the liner 216. As shown, the uppermost surface 206 of the recessed first dielectric layer 204 is lower than the uppermost surfaces 214, 216, and 222 of the barrier 212, the liner 216, and the lower level interconnect 220, respectively.

In accordance with at least one embodiment of the present disclosure, the performance of operation 108 further includes forming spacers in direct contact with the side surfaces of the barrier that were exposed by recessing the first dielectric layer. Each of the spacers extends to a thickness from a respective side surface of the barrier. In accordance with at least one embodiment of the present disclosure, the thickness of the spacers can be approximately 3 nanometers. Accordingly, in such embodiments, each spacers extends approximately 3 nanometers outwardly from the corresponding side surface of the barrier.

In accordance with at least one embodiment of the present disclosure, the spacers can be made of silicon nitride (SiN). In accordance with at least one embodiment of the present disclosure, the spacers can be formed by conformally depositing a layer of silicon nitride over the entire structure and then performing a directional etch back process to remove the silicon nitride from surfaces other than the exposed side surfaces of the barrier.

Figure 2C:
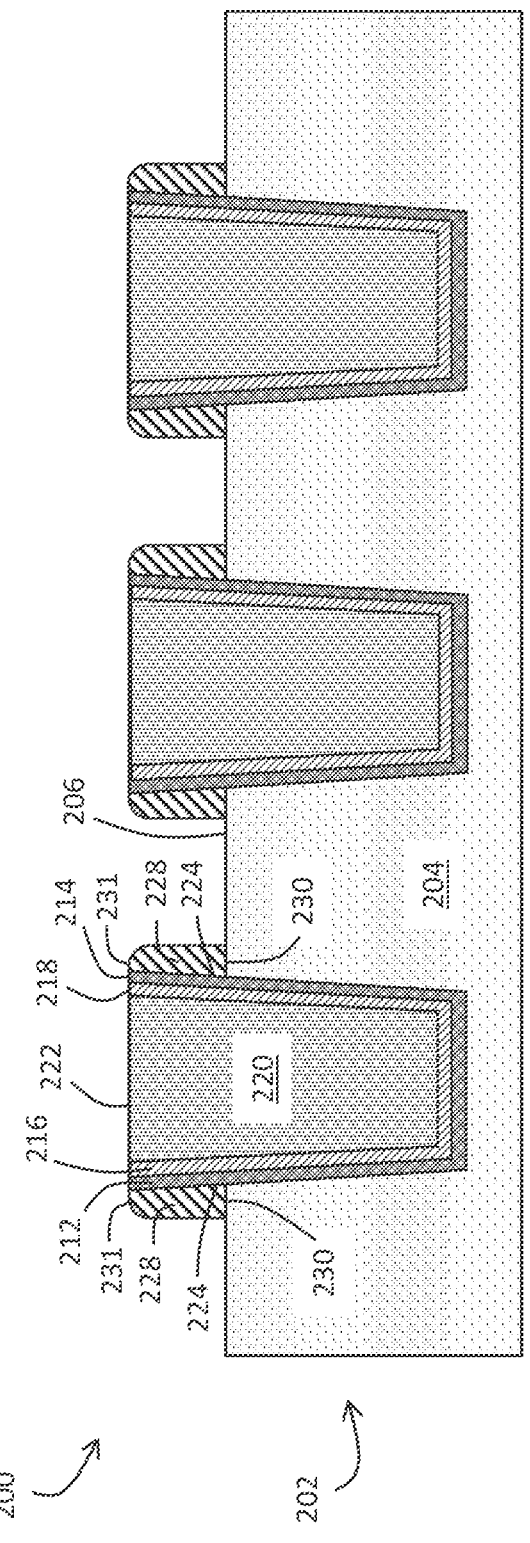
FIG. 2C illustrates an example of a component following the performance of a portion of the example method of FIG. 1, in accordance with embodiments of the present disclosure.

FIG. 2C depicts the structure 200 following the performance of the above portion of operation 108. As shown, spacers 228 are formed on the exposed side surfaces 224 of the barrier 212. More specifically, a spacer 228 is formed in direct contact with each of the exposed side surfaces 224 of the barrier 212. Each spacer 228 is formed in direct contact with the uppermost surface 206 of the first dielectric layer 204 such that a lowermost surface 230 of each spacer 228 is in direct contact with the uppermost surface 206 of the first dielectric layer 204. Additionally, each spacer 228 has an uppermost surface 231 that is substantially coplanar with the uppermost surfaces 214, 216, and 222 of the barrier 212, the liner 216, and the lower level interconnect 220.

Returning to FIG. 1, following the performance of operation 108, the method 100 proceeds with the performance of operation 112, wherein a second dielectric layer is formed. In accordance with at least one embodiment of the present disclosure, the performance of operation 112 includes the performance of a number of sub-operations.

More specifically, operation 112 includes recessing the barrier, the liner, and the interconnect material between the spacers. In particular, an amount of the barrier, the liner, and the interconnect material are removed such that the uppermost surfaces of the barrier, the liner, and the interconnect material are nearer to the uppermost surface of the first dielectric layer than they were prior to being recessed. Additionally, the uppermost surfaces of the recessed barrier, liner, and interconnect material are lower than the uppermost surfaces of the spacers. In accordance with at least one embodiment of the present disclosure, the barrier, the liner, and the interconnect material are recessed by approximately 7 to approximately 10 nanometers.

Notably, even after recessing, the uppermost surfaces of the barrier, the liner, and the interconnect material remain higher than the uppermost surface of the first dielectric layer. In other words, the barrier, the liner, and the interconnect material are recessed to a lesser extent than the extent to which the first dielectric layer was recessed. Therefore, the uppermost surfaces of the barrier, the liner, and the interconnect material are higher than the lowermost surfaces of the spacers, which are arranged in direct contact with the uppermost surface of the first dielectric layer, and are lower than the uppermost surfaces of the spacers, which were not recessed. In other words, the uppermost surfaces of the recessed barrier, liner, and interconnect material are aligned with the bodies of the spacers. As used herein, the phrase "bodies of the spacers" refers to the portions of material that makes up the spacers and that are arranged between the uppermost surfaces and the lowermost surfaces of each of the spacers. As used herein, the phrase "aligned with [something]" refers to arrangement in a geometric plane that intersects with that thing.

The height of the uppermost surfaces of the barrier, the liner, and the interconnect material relative to the heights of the uppermost surfaces of the spacers and the uppermost surface of the first dielectric layer provide a staggered interface whereat the uppermost surfaces of the barrier, the liner, and the interconnect material are aligned with the bodies of the spacers rather than the uppermost or lowermost surfaces of the spacers. As explained in further detail below, this staggered interface provides the physical barrier that creates a long migration path between the uppermost surfaces of the barrier, the liner, and the interconnect material and the first dielectric layer.

Figure 2D:
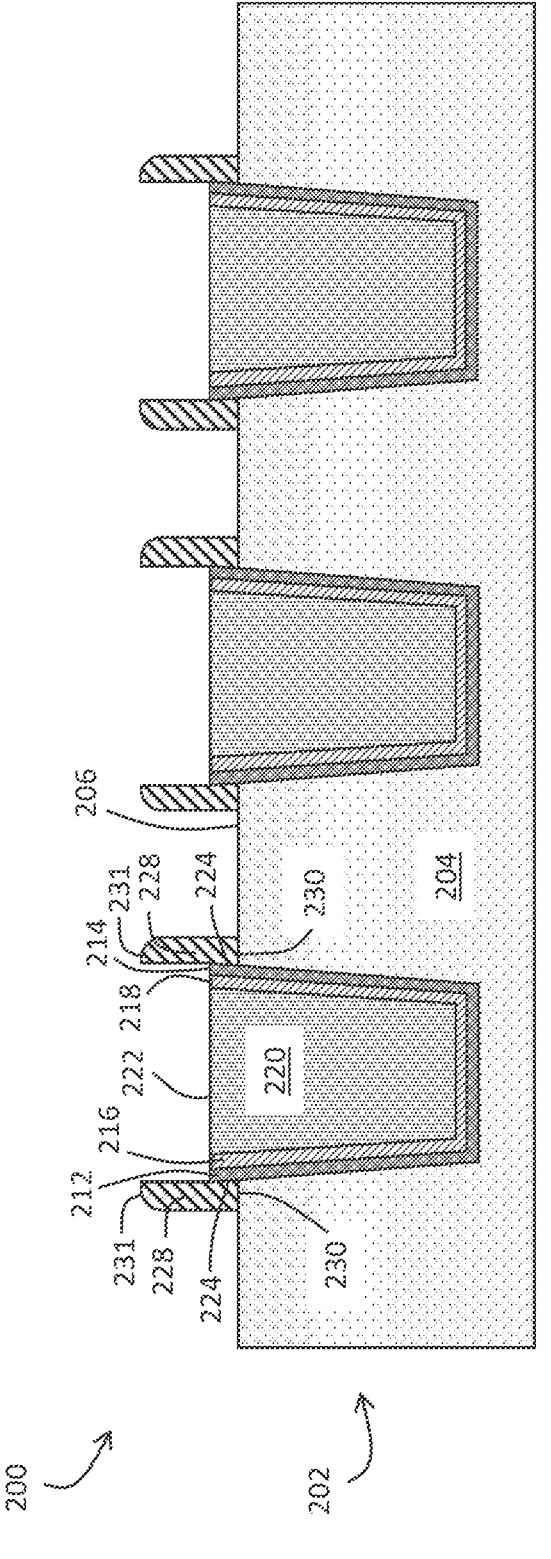
FIG. 2D illustrates an example of a component following the performance of a portion of the example method of FIG. 1, in accordance with embodiments of the present disclosure.

FIG. 2D depicts the structure 200 following the performance of this portion of operation 112. As shown, the barrier 212, the liner 216, and the lower level interconnect 220 have been recessed between the spacers 228 such that the uppermost surface 214 of the barrier 212, the uppermost surface 218 of the liner 216, and the uppermost surface 222 of the lower level interconnect 220 are generally aligned with the bodies of the spacers 228. In other words, the recessed uppermost surfaces 214, 218, and 222 are higher than the uppermost surface 206 of the first dielectric layer 204 and, therefore, higher than the lowermost surface 230 of each of the spacers 228. Additionally, the uppermost surfaces 214, 218, and 222 are lower than the uppermost surface 231 of each of the spacers 228.

In accordance with at least one embodiment of the present disclosure, the performance of operation 112 further includes capping the uppermost surface of the interconnect with a capping layer. The capping layer protects the interconnect during subsequent fabrication processes. In accordance with at least one embodiment of the present disclosure, the capping layer can be made of, for example, cobalt. Notably, while the capping layer provides protection for the interconnect, it is also susceptible itself to degradation and migration during subsequent fabrication processes. As explained in further detail below, the problematic migration of this capping layer into surrounding dielectric material during subsequent fabrication processes is prevented by the spacers.

Figure 2E:
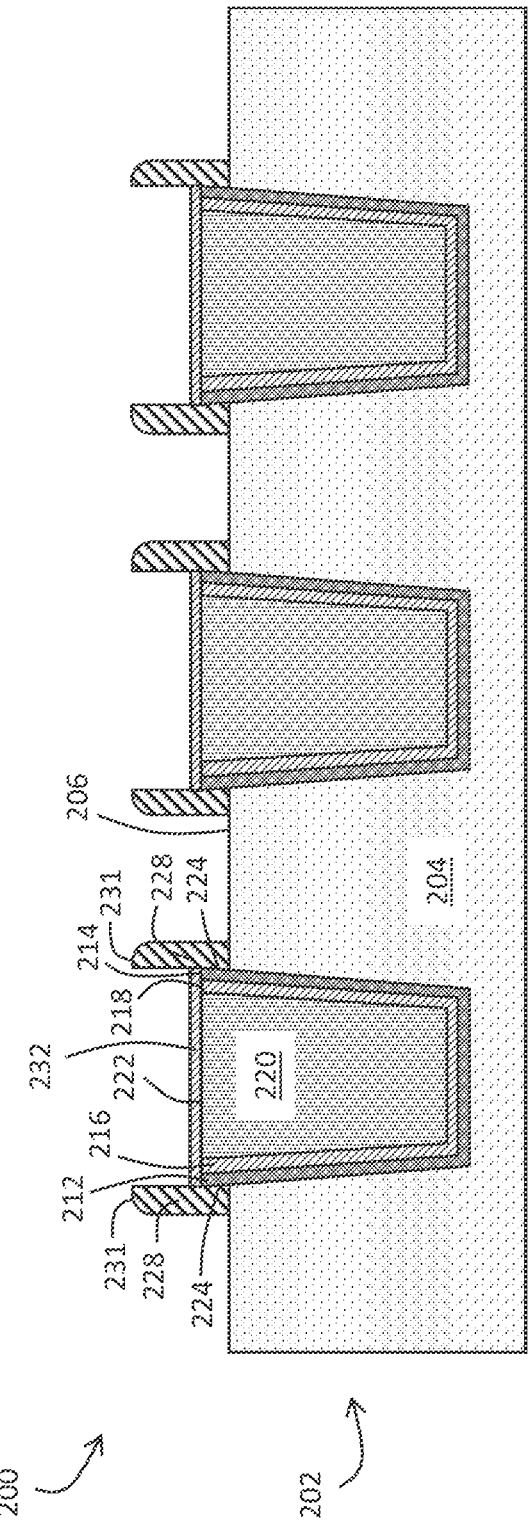
FIG. 2E illustrates an example of a component following the performance of a portion of the example method of FIG. 1, in accordance with embodiments of the present disclosure.

FIG. 2E depicts the structure 200 following the performance of this portion of operation 112. As shown, a capping layer 232 has been applied to the uppermost surfaces 214, 218, and 222 of the recessed barrier 212, liner 216, and interconnect material 220, respectively. Accordingly, the capping layer 232 is aligned with the bodies of the spacers 228. Therefore, the capping layer 232 is arranged at the staggered interface between the uppermost surfaces 214, 218, and 222 of the barrier 212, the liner 216, and the interconnect material 220, respectively, and the uppermost surfaces 231 of the spacers 228 and the uppermost surface 206 of the first dielectric layer 204. Thus, the capping layer 232 is separated from the dielectric material of the first dielectric layer 204 by prohibitively long migration paths that extend up and over the uppermost surfaces 231 of the spacers 228. As a result, the material of the capping layer 232, for example cobalt, is very unlikely to be able to migrate or diffuse into the surrounding dielectric material during subsequent FAV fabrication processes, such as RIE.

In accordance with at least one embodiment of the present disclosure, the performance of operation 112 further includes forming an etch stop layer (ESL) on top of the structure. The ESL can be formed, for example, by conformal deposition. In accordance with at least one embodiment of the present disclosure, the ESL has a thickness of approximately 3 nanometers. Accordingly, in such embodiments, the combined thickness of the spacer and the ESL on the outside of the spacer is approximately 6 nanometers. In accordance with at least one embodiment of the present disclosure, the ESL can be made of, for example, AlOx, SiN, HfOx, ZrOx, or another similar material.

Figure 2F:
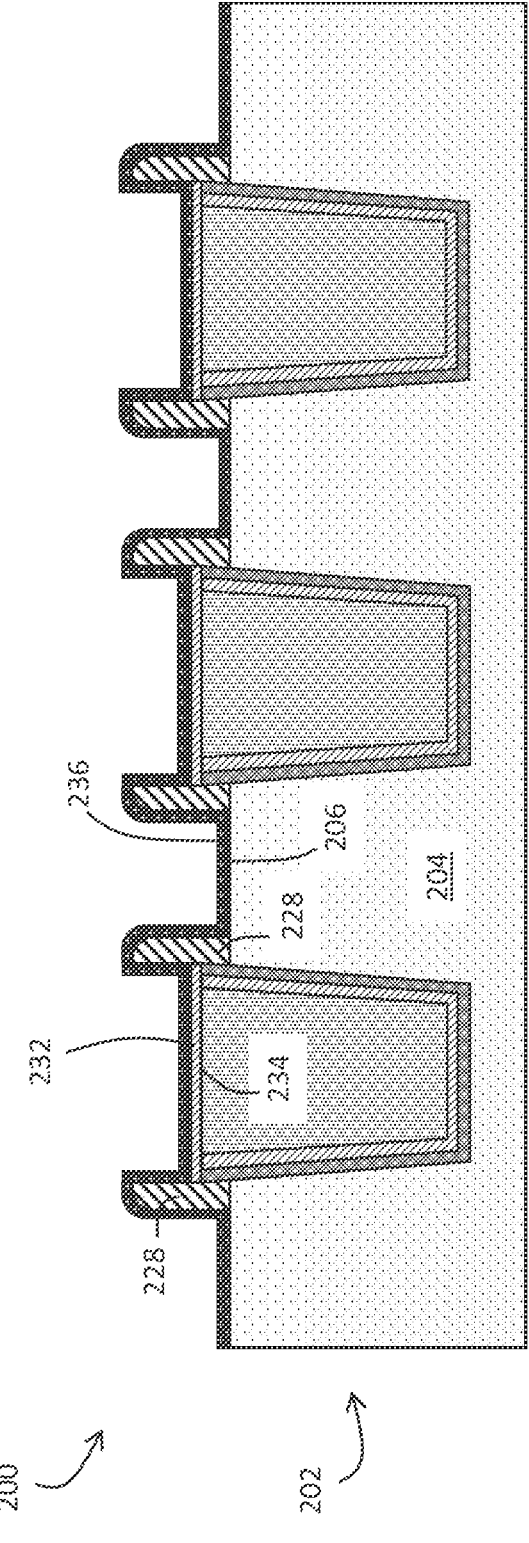
FIG. 2F illustrates an example of a component following the performance of a portion of the example method of FIG. 1, in accordance with embodiments of the present disclosure.

FIG. 2F depicts the structure 200 following the performance of this portion of operation 112. As shown, an ESL 236 has been deposited over the entire structure 200. Accordingly, as shown, the ESL 236 covers the uppermost surface 206 of the first dielectric layer 204, exposed surfaces of the spacers 228, and an uppermost surface 234 of the capping layer 232.

In accordance with at least one embodiment of the present disclosure, the performance of operation 112 further includes applying a second layer of dielectric material on the structure. In particular, the second dielectric material is applied such that it is in direct contact with the ESL. In accordance with some embodiments of the present disclosure, the second dielectric layer is applied using a FCVD process such that the FCVD dielectric material of the second dielectric layer fills lower areas above portions of the structure that were previously recessed.

As explained in further detail below, the resulting second dielectric layer is a sacrificial layer and will be used for upper layer metallization. In accordance with at least one embodiment of the present disclosure, the dielectric material used for the second dielectric layer can be a low-k dielectric. In particular, the low-k dielectric can be one that is suitable for application by FCVD processes. In some embodiments, the dielectric material of the second dielectric layer can be the same as the dielectric material of the first dielectric layer. Alternatively, the dielectric material of the second dielectric layer can be a different FCVD low-k dielectric material than that used for the first dielectric layer. In such embodiments, the material used for the second dielectric layer has a higher k value than SiO2, and the second dielectric layer is thinner than the first dielectric layer.

Figure 2G:
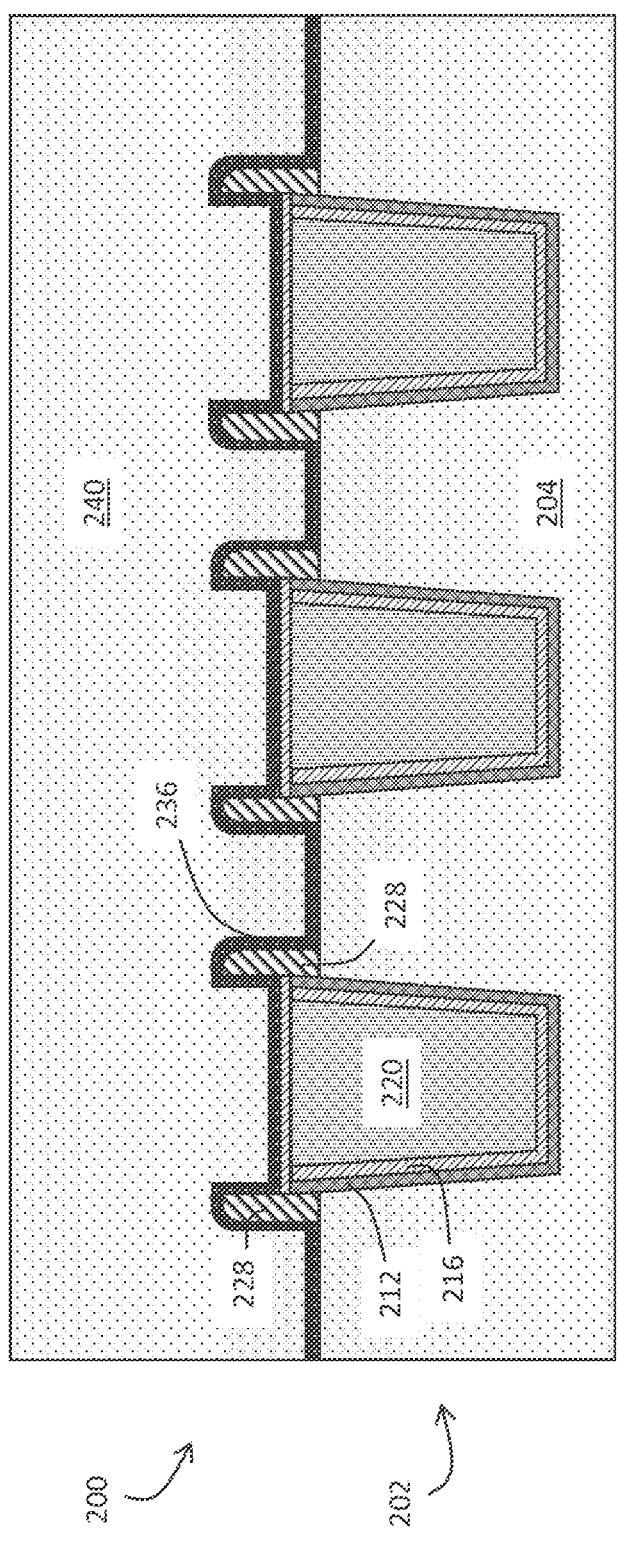
FIG. 2G illustrates an example of a component following the performance of a portion of the example method of FIG. 1, in accordance with embodiments of the present disclosure.

FIG. 2G depicts the structure 200 following the performance of this portion of the operation 112. Moreover, FIG. 2G depicts the structure 200 following the performance of the entirety of operation 112. As shown, a second dielectric layer 240 has been formed on the structure 200. The second dielectric layer 240 is in direct contact with the ESL 236 and fills lower areas above portions of the structure 200 that were previously recessed. For example, the second dielectric layer 240 fills areas above the recessed portions of the first dielectric layer 204 and above the recessed portions of the barrier 212, liner 216, and lower level interconnect 220 between the spacers 228.

Returning to FIG. 1, following the performance of operation 112, the method 100 proceeds with the performance of operation 116, wherein an upper level of the structure is metallized. In other words, operation 116 includes forming upper level interconnect structures. In accordance with at least one embodiment of the present disclosure, the performance of operation 116 includes the performance of a number of sub-operations.

More specifically, operation 116 includes upper level via and line trench patterning and etching. In particular, the performance of operation 116 includes performing at least one selective patterning and etching procedures. The selective patterning and etching procedures form the trenches that will be filled subsequently with interconnect material to form vias and lines in the upper level of the semiconductor component.

In some areas of the structure, the second dielectric layer is etched away down to the ESL. Such areas form deeper trenches, which will be filled subsequently with interconnect material to form vias that will connect lines in the upper level and lower level of the semiconductor component. Accordingly, such trenches can be referred to as via trenches. Notably, the via trenches are formed such that their side walls are partially formed on top of the ESL that covers the spacers. This arrangement is made possible, in part, due to the combined thickness of the ESL and the spacer. In some other areas of the structure, some amounts of the second dielectric layer are etched away such that some amount of the second dielectric layer remains above the ESL. Such areas form shallower trenches, which will be filled subsequently with interconnect material to form upper level lines. Accordingly, such trenches can be referred to as line trenches.

The upper level via and line trenches can be formed, for example, by performing a dual damascene scheme. In accordance with at least one embodiment of the present disclosure, the at least one selective patterning and etching procedures includes performing RIE. The capping layer protects the underlying lower level interconnect during such procedures. Problematic diffusion and migration of the capping layer into surrounding dielectric material during such procedures is prevented by the prohibitively long migration paths created by the spacers.

Figure 2H:
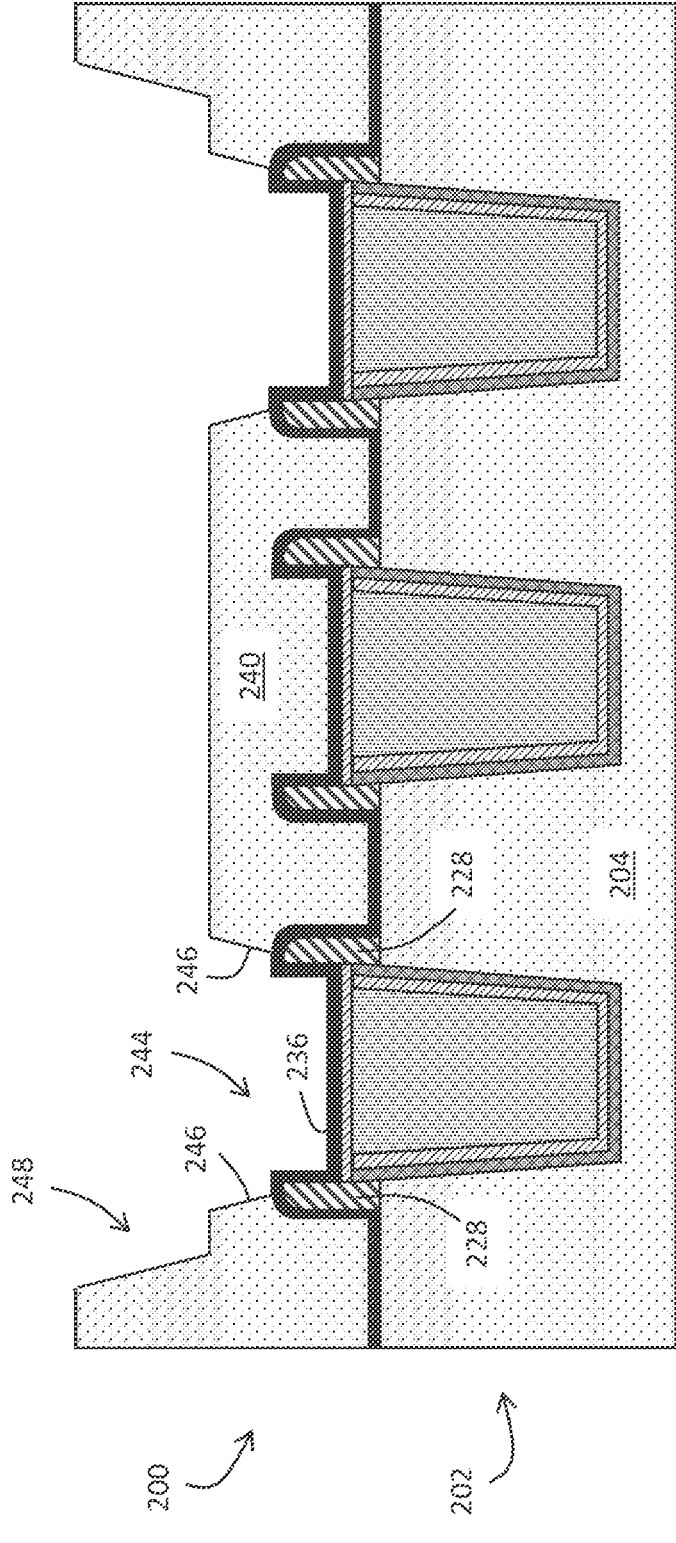
FIG. 2H illustrates an example of a component following the performance of a portion of the example method of FIG. 1, in accordance with embodiments of the present disclosure.

FIG. 2H depicts the structure 200 following the performance of this portion of operation 116. As shown, the second dielectric layer 240 has been selectively etched to form via trenches 244 and line trenches 248. As discussed above, the via trenches 244 are formed such that their side walls 246 are partially formed on top of the ESL 236 that covers the spacers 228. In other words, each of the side walls 246 of the via trenches 244 is aligned with the uppermost surface 231 of a corresponding spacer 228 amid the thickness dimension of the spacers 228. Thus, each of the side walls 246 of the via trenches 244 lies in a plane that intersects the uppermost surface 231 of the corresponding spacer 228.

In accordance with at least one embodiment of the present disclosure, the performance of operation 116 further includes performing selective ESL removal. More specifically, the ESL is selectively removed from those areas where it has been exposed by the formation of the via trenches. In such embodiments, the capping layer is typically incidentally removed along with the ESL. Accordingly, in such embodiments, the selective removal of the ESL results in the exposure of the uppermost surfaces of the barrier, liner, and lower level interconnect as well as inwardly facing surfaces of the spacers. For embodiments wherein the capping layer or a portion of the capping layer remains following the removal of the ESL, the functions of the resulting structure are not impacted, and the method proceeds in the same manner.

Figure 2I:
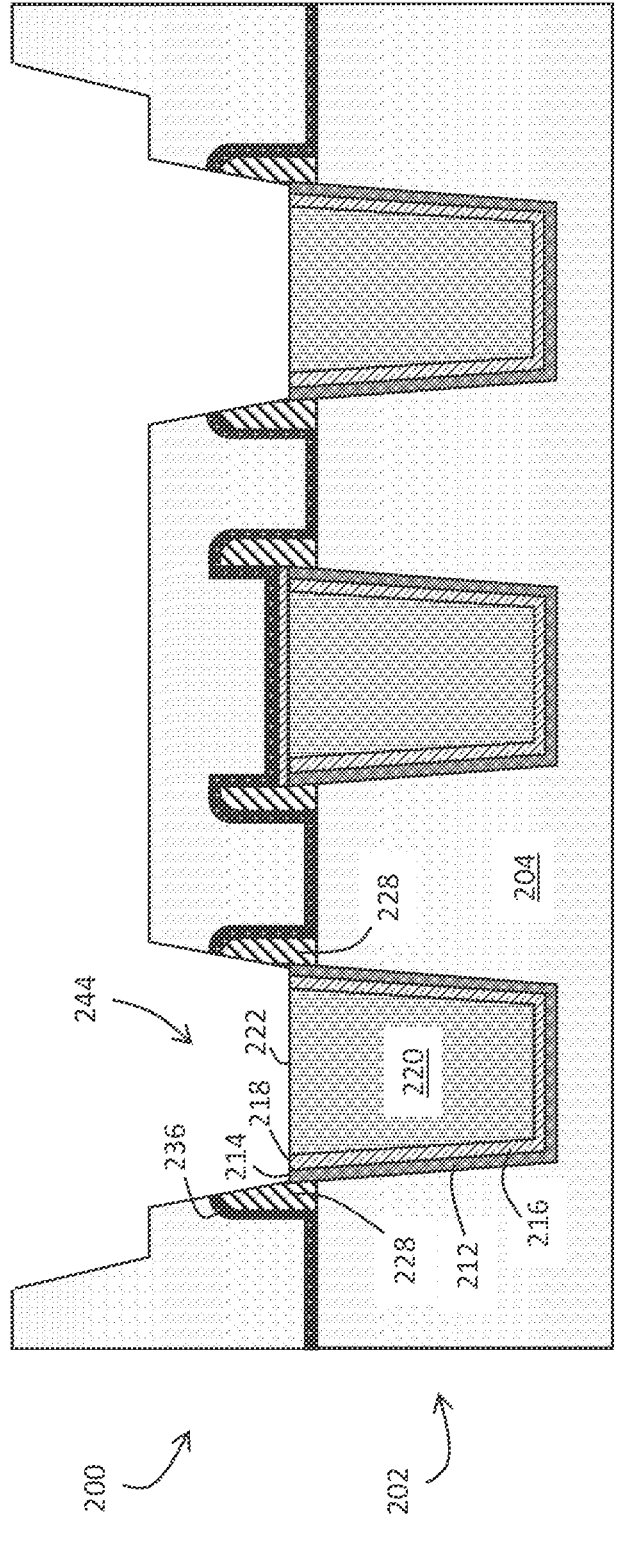
FIG. 2I illustrates an example of a component following the performance of a portion of the example method of FIG. 1, in accordance with embodiments of the present disclosure.

FIG. 2I depicts the example structure 200 following the performance of this portion of operation 116. In particular, in FIG. 2I, the ESL 236 and the capping layer 232 (shown in FIG. 2H) have been removed where they were exposed by the formation of the via trenches 244. Accordingly, following the selective removal, the uppermost surfaces 214, 218, and 222 of the barrier 212, liner 216, and lower level interconnect 220, respectively, are exposed. Additionally, inwardly facing surfaces of the spacers 228 are also exposed.

In accordance with at least one embodiment of the present disclosure, the performance of operation 116 further includes forming upper level lines and vias in the semiconductor component. In accordance with some embodiments of the present disclosure, this includes forming a barrier, a liner, and an upper level interconnect that are substantially similar in structure, material, and function to those described above with respect to the lower level of the structure.

Figure 2J:
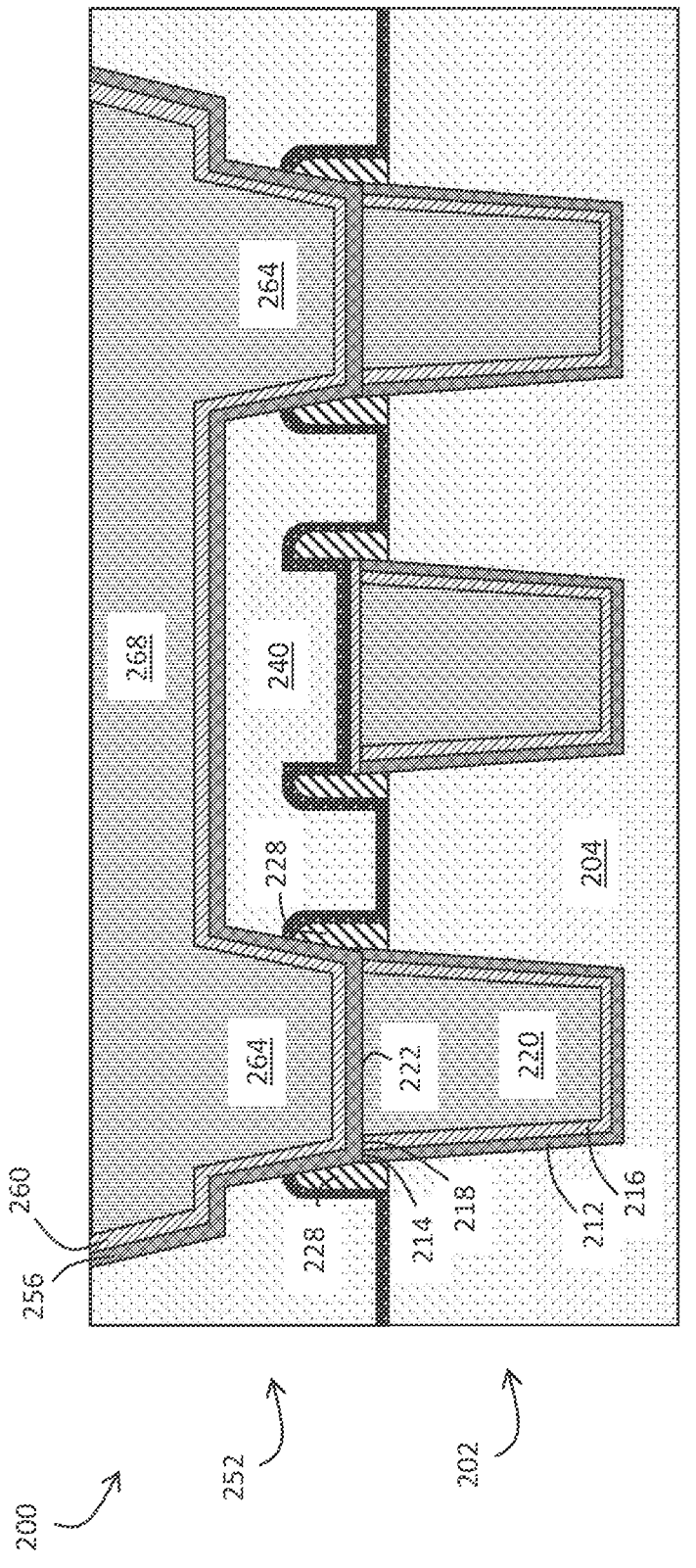
FIG. 2J illustrates an example of a component following the performance of a portion of the example method of FIG. 1, in accordance with embodiments of the present disclosure.

FIG. 2J depicts the example structure 200 following the performance of this portion of operation 116. Moreover, FIG. 2J depicts the example structure following the performance of the entirety of operation 116. Therefore, FIG. 2J depicts the example structure following the performance of the entirety of the method 100.

As shown in FIG. 2J, following the performance of operation 116, the structure 200 includes an upper level 252 that includes the second dielectric layer 240. The via trenches 244 and line trenches 248 (shown in FIG. 2H) formed in the second dielectric layer 240 have been coated with a further barrier 256, coated with a further liner 260, and remaining volume has been filled with interconnect material to form vias 264 and an upper level line 268.

Accordingly, the bottom of each via 264 of the upper level 252 of the structure 200 is arranged on top of the uppermost surfaces 214, 218, and 222 of the barrier 212, liner 216, and lower level interconnect 220 of a corresponding lower level interconnect 220 of the lower level 202 of the structure 200. In other words, the lower level 202 meets the upper level 252 of the structure 200 at an interface wherein the further barrier 256 and the further liner 260 are interposed between the lower level interconnect 220 and the via 264. Furthermore, this interface is arranged between the spacers 228. Thus, the interface is aligned with the bodies of the spacers 228.

Embodiments of the present disclosure provide a physical barrier between capping and/or liner materials in the interconnect recesses and the surrounding dielectric materials. In particular, as shown in FIG. 2J, the spacers 228 embody this physical barrier and help prevent diffusion of the capping layer 232 (shown in FIG. 2H) into the first dielectric layer 204 during fabrication processes, such as RIE, that are performed during the performance of operations 112 and 116 of the method 100 (shown in FIG. 1).

As described above, the spacers 228 are formed such that material interfaces are aligned with the bodies of the spacers 228, creating such long migration paths for any capping and/or barrier materials to travel before they could reach surrounding dielectric materials that such migration and diffusion is thereby prevented.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the fore-going. A computer readable storage medium, as used herein, is not to be construed as being transitory signals per se, such as radio waves or other freely propagating electromagnetic waves, electromagnetic waves propagating through a wave-guide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may com-prise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, con-figuration data for integrated circuitry, or either source code or object code written in any combination of one or more programming languages, including an object oriented pro-gramming language such as Smalltalk, C++, or the like, and procedural programming languages, such as the "C" pro-gramming language or similar programming languages. The computer readable program instructions may execute entirely on the user's computer, partly on the user's com-puter, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program prod-ucts according to embodiments of the invention. It will be understood that each block of the flowchart illustrations and/or block diagrams, and combinations of blocks in the flowchart illustrations and/or block diagrams, can be imple-mented by computer readable program instructions.

These computer readable program instructions may be provided to a processor of a computer, or other program-mable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data process-ing apparatus, or other device to cause a series of operational steps to be performed on the computer, other programmable apparatus or other device to produce a computer imple-mented process, such that the instructions which execute on the computer, other programmable apparatus, or other device implement the functions/acts specified in the flow-chart and/or block diagram block or blocks.

The flowchart and block diagrams in the Figures illustrate the architecture, functionality, and operation of possible implementations of systems, methods, and computer pro-gram products according to various embodiments of the present invention. In this regard, each block in the flowchart or block diagrams may represent a module, segment, or portion of instructions, which comprises one or more executable instructions for implementing the specified logi-cal function(s). In some alternative implementations, the functions noted in the blocks may occur out of the order noted in the Figures. For example, two blocks shown in succession may, in fact, be accomplished as one step, executed concurrently, substantially concurrently, in a par-tially or wholly temporally overlapping manner, or the blocks may sometimes be executed in the reverse order, depending upon the functionality involved. It will also be noted that each block of the block diagrams and/or flowchart illustration, and combinations of blocks in the block dia-grams and/or flowchart illustration, can be implemented by special purpose hardware-based systems that perform the specified functions or acts or carry out combinations of special purpose hardware and computer instructions.

The terminology used herein is for the purpose of describ-ing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specifica-tion, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, refer-ence was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous spe-cific details were set forth to provide a thorough understand-ing the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor component, comprising:
a dielectric layer having an uppermost surface;
a further dielectric layer arranged above the uppermost surface of the dielectric layer;
an interconnect formed in the dielectric layer, wherein the interconnect is comprised of a plurality of interconnect elements, wherein each of the plurality of interconnect elements have a first tapered sidewall and an uppermost surface that is arranged higher than the uppermost surface of the dielectric layer;
a liner layer located around each of the plurality of interconnect elements;
a barrier layer located around the liner layer;
a further interconnect that includes a plurality of further interconnect elements, wherein each of the further interconnect elements have a second tapered sidewall, the further interconnect formed in the further dielectric layer such that the one of plurality of further interconnect elements is in direct contact with one of the plurality of the interconnect elements;
a metal line connecting two of the plurality of further interconnect elements, wherein the metal line extends over a bypassed interconnect element, wherein the bypassed interconnect element is located between two of the plurality of interconnect elements that are connected to two of the plurality of further interconnect elements;
a spacer comprising an uppermost surface that is arranged higher than the uppermost surface of the interconnect, a bottom surface in direct contact with the uppermost surface of the dielectric layer, a first internal side surface in direct contact with the first tapered sidewall of the interconnect, and a second internal side surface in direct contact with the second tapered sidewall of the further interconnect, wherein the spacer is in contact with the barrier layer located around each of the plurality of interconnect elements; and
a capping layer located on top of the bypassed interconnect element, wherein a bottom surface of the capping layer is in contact with a top surface of the bypassed interconnect element, a top surface of the liner layer, and a top surface of the barrier layer, wherein the capping layer is in contact with a side surface of the spacer, wherein the spacer extends past a top surface of the capping layer.

2. The semiconductor component of claim 1, wherein:
the first tapered sidewall extends above the uppermost surface of the dielectric layer.

3. The semiconductor component of claim 1, wherein:
the interconnect includes:
a barrier arranged in direct contact with the dielectric layer,
a liner arranged in direct contact with the barrier, and
an interconnect body arranged in direct contact with the liner.

4. The semiconductor component of claim 1, further comprising:
an etch stop layer between and in direct contact with the dielectric layer and the further dielectric layer.

5. The semiconductor component of claim 4, wherein:
the further interconnect is in direct contact with the interconnect at an interface, and
the interface is arranged higher than the uppermost surface of the dielectric layer and lower than the uppermost surface of the spacer.

6. The semiconductor component of claim 4, wherein:
the etch stop layer is in direct contact with and respectively between the further dielectric layer and the spacer.

7. A semiconductor component, comprising:
a lower level dielectric having an uppermost surface;
a upper level dielectric arranged above the uppermost surface of the lower level dielectric;

a lower interconnect formed in the lower level dielectric, wherein the lower interconnect is comprised of a plurality of lower interconnect elements, wherein each of the plurality of lower interconnect elements have a first tapered sidewall and an uppermost surface that is arranged higher than the uppermost surface of the lower level dielectric;

a liner layer located around each of the plurality of interconnect elements;

a barrier layer located around the liner layer;

an upper interconnect that includes a plurality of further upper interconnect elements, wherein each of the upper interconnect elements have a second tapered sidewall, the upper interconnect formed in the upper level dielectric such that the one of plurality upper interconnect elements is in direct contact with one of the plurality of the lower interconnect elements;

a metal line connecting two of the plurality of upper interconnect elements, wherein the metal line extends over a bypassed lower interconnect element, wherein the bypassed interconnect is located between two of the plurality of lower interconnect elements that are connected to two of the plurality of upper interconnect elements;

a spacer comprising an uppermost surface that is arranged higher than the uppermost surface of the lower interconnect, a bottom surface in direct contact with the uppermost surface of the lower level dielectric, a first internal side surface in direct contact with the first tapered sidewall of the lower interconnect, and a second internal side surface in direct contact with the second tapered sidewall of the upper interconnect, wherein the spacer is in contact with the barrier layer located around each of the plurality of interconnect elements; and a capping layer located on top of the bypassed interconnect element, wherein a bottom surface of the capping layer is in contact with a top surface of the bypassed interconnect element, a top surface of the liner layer, and a top surface of the barrier layer, wherein the capping layer is in contact with a side surface of the spacer, wherein the spacer extends past a top surface of the capping layer.

8. The semiconductor component of claim 7, wherein:

the first tapered sidewall of the lower interconnect extend partially above the uppermost surface of the lower level dielectric.

9. The semiconductor component of claim 7, wherein:

the upper interconnect is in direct contact with the lower interconnect at an interface, and the interface is arranged higher than the uppermost surface of the lower level dielectric and lower than the uppermost surface of the spacers.

10. The semiconductor component of claim 7, wherein:

the upper interconnect is in direct contact with the spacer.

\*  \*  \*  \*  \*